(12) United States Patent
Hiza et al.

(10) Patent No.: US 11,961,765 B2
(45) Date of Patent: Apr. 16, 2024

(54) METHOD FOR MANUFACTURING A SEMICONDUCTOR SUBSTRATE AND DEVICE BY BONDING AN EPITAXIAL SUBSTRATE TO A FIRST SUPPORT SUBSTRATE, FORMING A FIRST AND SECOND PROTECTIVE THIN FILM LAYER, AND EXPOSING AND BONDING A NITRIDE SEMICONDUCTOR LAYER TO A SECOND SUPPORT SUBSTRATE

(71) Applicant: Mitsubishi Electric Corporation, Tokyo (JP)

(72) Inventors: Shuichi Hiza, Tokyo (JP); Kunihiko Nishimura, Tokyo (JP); Masahiro Fujikawa, Tokyo (JP); Yuki Takiguchi, Tokyo (JP); Eiji Yagyu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 406 days.

(21) Appl. No.: 17/605,002

(22) PCT Filed: May 23, 2019

(86) PCT No.: PCT/JP2019/020424
§ 371 (c)(1),
(2) Date: Oct. 20, 2021

(87) PCT Pub. No.: WO2020/235074
PCT Pub. Date: Nov. 26, 2020

(65) Prior Publication Data
US 2022/0230920 A1    Jul. 21, 2022

(51) Int. Cl.
*C30B 25/18*     (2006.01)
*C30B 29/40*     (2006.01)
(Continued)

(52) U.S. Cl.
CPC .......... *H01L 21/7806* (2013.01); *C30B 25/18* (2013.01); *C30B 29/406* (2013.01);
(Continued)

(58) Field of Classification Search
CPC ......... C30B 25/00; C30B 25/02; C30B 25/04; C30B 25/16; C30B 25/18; C30B 25/183;
(Continued)

(56) References Cited

U.S. PATENT DOCUMENTS

2022/0230920 A1* 7/2022 Hiza .................... H01L 21/568

FOREIGN PATENT DOCUMENTS

JP    6-268183 A    9/1994

OTHER PUBLICATIONS

International Search Report and Written Opinion dated Aug. 6, 2019, received for PCT Application PCT/JP2019/020424, Filed on May 23, 2019, 8 pages including English Translation.
(Continued)

*Primary Examiner* — Kenneth A Bratland, Jr.
(74) *Attorney, Agent, or Firm* — XSENSUS LLP

(57) ABSTRACT

The present invention relates to a method for manufacturing a semiconductor substrate, including: (a) preparing an epitaxial substrate having a nitride semiconductor layer formed on a first main surface of a growth substrate and preparing a first support substrate, forming a resin adhesive layer between the first main surface of the growth substrate and a first main surface of the first support substrate, and bonding the epitaxial substrate to the first support substrate; (b) thinning a second main surface of the growth substrate; (c) forming a first protective thin film layer on the thinned growth substrate; (d) forming a second protective thin film layer on the first support substrate; (e) removing the thinned growth substrate; (f) bonding a second support substrate
(Continued)

onto the nitride semiconductor layer; and (g) removing the first support substrate and the resin adhesive layer.

10 Claims, 17 Drawing Sheets

(51) Int. Cl.
    *C30B 33/00*     (2006.01)
    *H01L 21/02*     (2006.01)
    *H01L 21/48*     (2006.01)
    *H01L 21/78*     (2006.01)
    *H01L 23/373*     (2006.01)
    *H01L 29/20*     (2006.01)

(52) U.S. Cl.
    CPC ........ *C30B 33/00* (2013.01); *H01L 21/02389* (2013.01); *H01L 21/0254* (2013.01); *H01L 21/0262* (2013.01); *H01L 21/4803* (2013.01); *H01L 23/3732* (2013.01); *H01L 29/2003* (2013.01)

(58) Field of Classification Search
    CPC ....... C30B 25/186; C30B 29/00; C30B 29/10; C30B 29/40; C30B 29/403; C30B 29/406; C30B 33/00; C30B 33/06; C30B 33/08; C30B 33/12; H01L 21/02389; H01L 21/0254; H01L 21/0262; H01L 21/4803; H01L 21/7806; H01L 23/3732; H01L 29/2003
    USPC .......... 117/84, 88, 94–95, 97, 101, 105–106, 117/937, 952
    See application file for complete search history.

(56) References Cited

OTHER PUBLICATIONS

Ejeckam, "Keeping Cool with Diamond", Compound Semiconductor, vol. 20, Issue 7, 2014, pp. 41-46.
Francis et al., "Formation and Characterization of 4-inch GaN-on-diamond Substrates", Diamond & Related Materials, vol. 19, 2010, pp. 229-233.
Masaaki et al., "Present Status and Outlook of High Power AlGaN/GaN Heterojunction FETs", The Journal of the Institute of Electronics, Information and Communication Engineers C, vol. J86-C, No. 4, Apr. 2003, pp. 396-403 (16 pages including English Translation).

* cited by examiner

F I G. 1
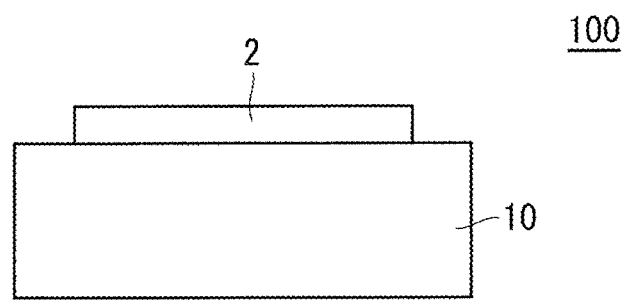

F I G. 2
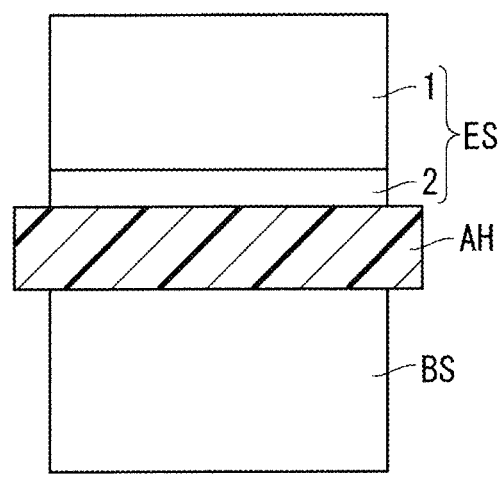

F I G. 3
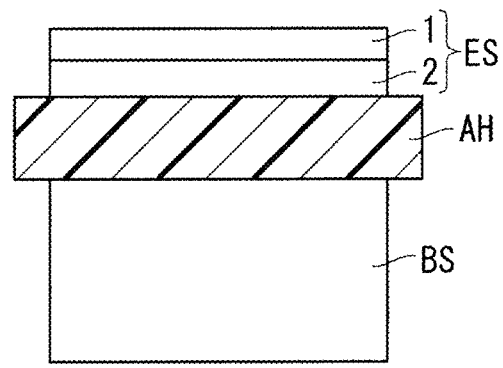

F I G. 7
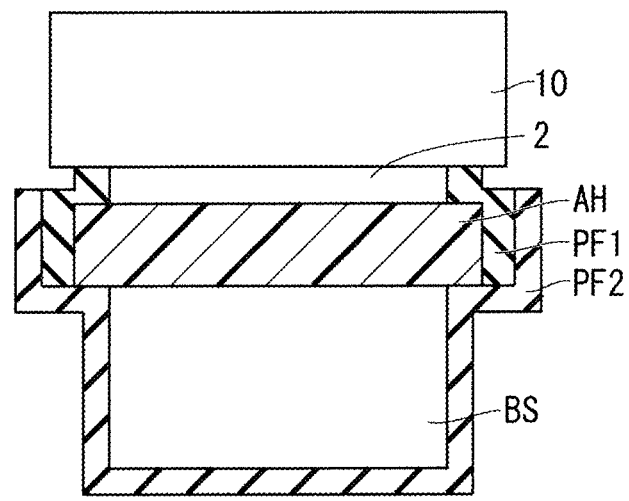

F I G. 1 0
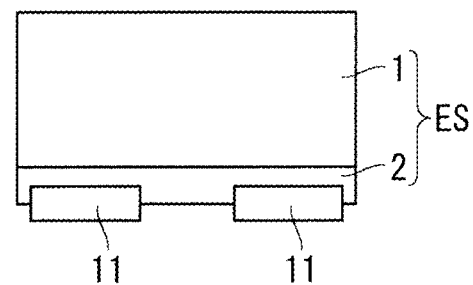

F I G. 1 6
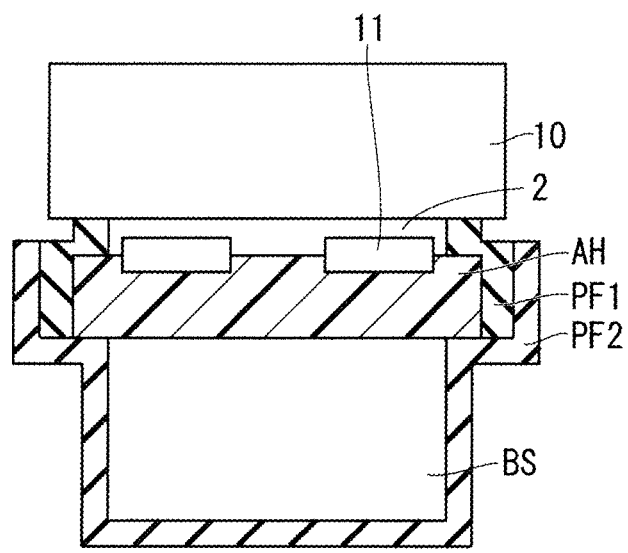

METHOD FOR MANUFACTURING A
SEMICONDUCTOR SUBSTRATE AND
DEVICE BY BONDING AN EPITAXIAL
SUBSTRATE TO A FIRST SUPPORT
SUBSTRATE, FORMING A FIRST AND
SECOND PROTECTIVE THIN FILM LAYER,
AND EXPOSING AND BONDING A NITRIDE
SEMICONDUCTOR LAYER TO A SECOND
SUPPORT SUBSTRATE

CROSS-REFERENCE TO RELATED APPLICATION

The present application is based on PCT filing PCT/JP2019/020424, filed May 23, 2019, the entire contents of which are incorporated herein by reference.

TECHNICAL FIELD

The present invention relates to a method for manufacturing a semiconductor substrate and, more particularly, to a method for manufacturing a semiconductor substrate on which a nitride semiconductor layer is formed.

BACKGROUND ART

As a high-output semiconductor element, a field effect transistor using a nitride semiconductor, for example, a high electron mobility transistor (HEMT) is known. Such a semiconductor element shows significant deterioration in operating characteristics and reliability due to a temperature rise during a high-output operation. Therefore, in order to suppress the temperature rise of the semiconductor element, it often employs a configuration in which a material having high heat dissipation is provided in the vicinity of a heat generating part to dissipate heat. In particular, diamond is a material having the highest thermal conductivity among solid substances, and has properties suitable as a heat dissipation material. Therefore, for example, Non-Patent Document 1 discloses a technique for improving heat dissipation of a semiconductor element due to a structure in which a nitride semiconductor layer is formed on diamond.

As a technique of manufacturing the nitride semiconductor layer, a technique of forming a nitride semiconductor layer on a substrate composed of silicon (Si), silicon carbide (SiC), sapphire ($Al_2O_3$) or the like by heteroepitaxial growth has been established, and is widely used as a part of the technique of manufacturing the nitride semiconductor element.

On the other hand, a technique of directly forming a nitride semiconductor layer on a diamond substrate by the heteroepitaxial growth is still under study, and a method for manufacturing the nitride semiconductor layer has not been established. Therefore, as an example of the technique of forming a semiconductor layer on the diamond substrate, a method of bonding and integrating a semiconductor layer and a diamond substrate is disclosed in, for example, Non-Patent Document 2.

In addition, Patent Document 1 discloses a technique of bonding a first support substrate to a silicon on insulator (SOI) substrate using a resin adhesive layer, then polishing the SOI substrate to reduce the thickness, then bonding the thinned semiconductor substrate and a second support substrate, such as a sapphire substrate, using a low-melting-point glass film, and finally removing the first support substrate to form a semiconductor element on the second support substrate.

PRIOR ART DOCUMENTS

Patent Document

Patent Document 1: Japanese Patent Application Laid-Open No. H06-268183

Non-Patent Documents

Non-Patent Document 1: Felix Ejeckam "Keeping cool with diamond" COMPOUND SEMICONDUCTOR Volume 20 Issue 7 2014 41-46

Non-Patent Document 2: D. Francis, F. Faili, D. Babic, F. Ejeckam, A. Nurmikko, H. Maris "Formation and characterization of 4-inch GaN-on-diamond substrates" Diamond & Related Materials 19 (2010) 229-233

SUMMARY

Problem to be Solved by the Invention

In general, because a semiconductor layer formed on a growth substrate by epitaxial growth has an extremely thin film thickness of about several µm, it is impossible to perform a step of separating the semiconductor layer from the growth substrate and then bonding the semiconductor layer onto another substrate. Non-Patent Document 2 discloses a technique in which, in order to temporarily hold a nitride semiconductor layer formed on a growth substrate, a support substrate is bonded to the nitride semiconductor layer and then the growth substrate is removed, a diamond substrate is bonded onto a surface from which the growth substrate has been removed, and the support substrate is finally removed.

As a method of bonding the support substrate to the nitride semiconductor layer, the method of bonding using the resin adhesive layer as disclosed in Patent Document 1 can be adopted. However, in the nitride semiconductor layer formed by the heteroepitaxial growth on the substrate such as Si, SiC, or $Al_2O_3$, due to a difference in material between the growth substrate and the nitride semiconductor layer, coefficient of thermal expansion, lattice constant, and the like therebetween differ, which causes high internal stress. For this reason, due to the growth substrate that is thinned after the support substrate is bonded using the resin adhesive layer, there is a problem in which the internal stress of the nitride semiconductor layer is released, a crack is generated in the nitride semiconductor layer, and the operating characteristics of the semiconductor element finally formed in the nitride semiconductor layer are deteriorated.

The present invention has been made to solve the above problem, and an object of the present invention is to provide a method for manufacturing a semiconductor substrate in which a crack is suppressed from being generated in a nitride semiconductor layer due to internal stress of the nitride semiconductor layer.

Means to Solve the Problem

A method for manufacturing a semiconductor substrate includes: (a) preparing an epitaxial substrate formed by epitaxially growing a nitride semiconductor layer on a first main surface of a growth substrate being a nitride semiconductor substrate and preparing a first support substrate, forming a resin adhesive layer between the first main surface of the growth substrate and a first main surface of the first support substrate, and bonding the epitaxial substrate to the first support substrate; (b) removing, after the step (a), a second main surface of the growth substrate to a prescribed thickness to thin the growth substrate, the second main surface of the growth substrate being on a side opposite to the first main surface of the growth substrate on which the nitride semiconductor layer is formed; (c) forming, after the step (b), a first protective thin film layer from the second main surface of the thinned growth substrate to side surfaces of the resin adhesive layer; (d) forming, after the step (b), a second protective thin film layer from a second main surface of the first support substrate to the side surfaces of the resin adhesive layer, the second main surface of the first support substrate being on a side opposite to the first main surface of the first support substrate; (e) removing, after the steps (c) and (d), the thinned growth substrate and exposing the nitride semiconductor layer; (f) bonding, after the step (e), a second support substrate onto the nitride semiconductor layer; and (g) removing, after the step (f), the first support substrate and the resin adhesive layer.

Effects of the Invention

According to the method for manufacturing the semiconductor substrate according to the present invention, because the growth substrate is removed in a state in which a bonding portion between the nitride semiconductor layer and the growth substrate in the vicinity of the substrate end edge portion, which is likely to be a base point of a crack, is protected by the first or second protective thin film layer, the occurrence of the crack due to the internal stress contained in the nitride semiconductor layer can be suppressed. Therefore, it is possible to obtain a semiconductor substrate in which the nitride semiconductor layer is provided on a heterogeneous substrate having high heat dissipation such as a diamond substrate.

BRIEF DESCRIPTION OF DRAWINGS

FIG. 1 is a cross-sectional view showing a configuration of a semiconductor substrate according to a first embodiment of the present invention.

FIG. 2 is a cross-sectional view for describing a method for manufacturing the semiconductor substrate of the first embodiment according to the present invention.

FIG. 3 is a cross-sectional view for describing the method for manufacturing the semiconductor substrate of the first embodiment according to the present invention.

FIG. 7 is a cross-sectional view for describing the method for manufacturing the semiconductor substrate of the first embodiment according to the present invention.

FIG. 10 is a cross-sectional view for describing a method for manufacturing the semiconductor device of the second embodiment according to the present invention.

FIG. 16 is a cross-sectional view for describing the method for manufacturing the semiconductor device of the second embodiment according to the present invention.

DESCRIPTION OF EMBODIMENTS

Figure 4:
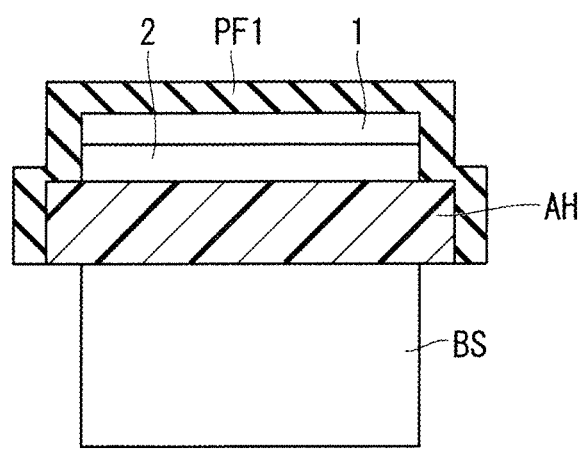
FIG. 4 is a cross-sectional view for describing the method for manufacturing the semiconductor substrate of the first embodiment according to the present invention.

Hereinafter, embodiments of a method for manufacturing a semiconductor substrate according to the present invention are described with reference to the drawings. Note that the drawings are schematically illustrated, and interrelationships in sizes and positions between images illustrated in different drawings are not necessarily accurately described, and relationships and ratios of dimensions in the length direction, the depth direction, and the height direction are different from actual ones. In addition, in the following description, similar constituent elements are denoted by the same reference numerals, and names and functions thereof are also similar. Thus, there is a case in which a detailed description thereof is omitted.

First Embodiment

FIG. 1 is a cross-sectional view showing a configuration of a semiconductor substrate 100 manufactured by a method for manufacturing a semiconductor substrate according to a first embodiment of the present invention. A semiconductor substrate 100 shown in FIG. 1 includes, for example, a nitride semiconductor layer 2 formed on a support substrate 10 having high thermal conductivity, such as a diamond substrate. The nitride semiconductor layer 2 is a semiconductor layer formed by heteroepitaxial growth on a growth substrate different from the support substrate 10, and is transferred onto the support substrate 10 in a state of maintaining a crystal plane developed during the heteroepitaxial growth as it is. Therefore, a high-quality nitride semiconductor element can be formed on the nitride semiconductor layer 2.

Next, a method for manufacturing the semiconductor substrate 100 is described with reference to FIGS. 2 to 8, which are cross-sectional views sequentially showing manufacturing steps.

FIG. 2 is a diagram for describing a first step of bonding a support substrate to the nitride semiconductor layer 2 heteroepitaxially grown on a growth substrate 1, using a resin adhesive layer.

In the first step, first, an epitaxial substrate ES is prepared, in which the heteroepitaxially-grown nitride semiconductor layer 2 is formed on a main surface of the growth substrate 1 being a nitride semiconductor substrate such as a gallium nitride (GaN) substrate.

Thereafter, a support substrate BS (first support substrate) selected from among a glass substrate, a sapphire substrate, an Si substrate, an SiC substrate, and the like is prepared, and the epitaxial substrate ES and the support substrate BS are bonded by a resin adhesive such that a main surface of the epitaxial substrate ES on a side on which the nitride semiconductor layer 2 is formed and a main surface (first main surface) for bonding of the support substrate BS face each other, whereby the epitaxial substrate ES and the support substrate BS are bonded by a resin adhesive layer AH.

As the resin adhesive, a known resin adhesive such as an acrylic resin, an epoxy resin, a silicone resin, or a modified silicone resin can be used, and it is preferable to use a non-solvent-diluted adhesive in which curing proceeds by a chemical reaction. For example, the acrylic resin, the epoxy resin, the silicone resin, or the like is preferred.

After the bonding, a curing treatment is performed for the purpose of improving the mechanical strength of the resin adhesive layer AH. As the curing conditions, any condition can be used depending on the resin adhesive layer AH to be used. For example, a heating treatment is performed for six hours in an air blowing drying furnace at 70° C.

Because the role of the support substrate BS is to support the nitride semiconductor layer 2 in subsequent steps, the support substrate BS is not limited to the substrate described above, and any material can be used as long as the support substrate withstands the steps from the viewpoint of heat resistance, mechanical strength, and resistance to a chemical solution used in the manufacturing steps.

FIG. 3 is a diagram for describing a second step of thinning the growth substrate 1 of a bonded substrate formed after the support substrate BS is bonded to the epitaxial substrate ES and the adhesive layer is cured.

In the second step, as shown in FIG. 3, a main surface (back surface) of the growth substrate 1, which is opposite to the main surface on which the nitride semiconductor layer 2 is formed, is removed to a prescribed thickness. As a removal method, mechanical polishing, dry etching, wet etching with a solution, or the like can be used, and it is preferable to use the mechanical polishing from the viewpoint of a removal rate. The thinning of the growth substrate 1 performed from the back surface side in this step is preferably performed such that the thickness of the growth substrate 1 is in a range of 5 μm or more and 100 μm or less, and more preferably performed so that the thickness of the growth substrate 1 is in a range of 7 μm or more and 30 μm or less.

If the thickness of the growth substrate 1 after this step is performed is larger than the above range, a process time in a fifth step to be performed later becomes longer, and the manufacturing cost of the semiconductor substrate 100 increases. On the other hand, if the thickness of the growth substrate 1 after this step is performed is smaller than the above range, the stress inside the nitride semiconductor layer 2 is released, and there is a possibility of a crack occurring.

FIG. 4 is a diagram for describing a third step of forming a protective thin film layer from the back surface of the growth substrate 1 to side surfaces of the resin adhesive layer AH, after the growth substrate 1 is thinned.

In the third step, as shown in FIG. 4, a protective thin film layer PF1 (first protective thin film layer) is formed from the back surface of the thinned growth substrate 1 to the side surfaces of the resin adhesive layer AH. As the protective thin film layer PF1, silicon oxide, silicon nitride, aluminum oxide, or the like can be used and any of these is suitable as the protective thin film layer PF1, and, from the viewpoint of mechanical strength, silicon nitride is preferred. The film thickness is set to, for example, 2 μm.

As a method for forming the protective thin film layer PF1, a known thin film method can be used such as a plasma chemical vapor deposition (CVD) method, a sputtering method, an atomic layer epitaxy (ALE) method, an atomic layer deposition (ALD) method, a catalytic CVD method which is a low-temperature thin film deposition method not using plasma, and a solution growth method, and any of these is suitable for forming the protective thin film layer PF1. However, the atomic layer deposition method is preferred from the viewpoint of compactness of the growth film and covering properties of the side surfaces of the substrate.

A heating temperature at the time of film formation in the case of forming the protective thin film layer PF1 by these forming methods is desirably less than the glass transition temperature that does not exceed the glass transition temperature of resin as the main component of the resin adhesive layer AH. In the case of the heating temperature at the time of film formation being higher than the glass transition temperature of the resin as the main component of the adhesive layer AH, there is a possibility that the effect as an adhesive layer for bonding the support substrate BS to the epitaxial substrate ES is significantly impaired by mechanical properties of the resin adhesive layer AH being significantly deteriorated or the thermal decomposition reaction proceeding.

Figure 5:
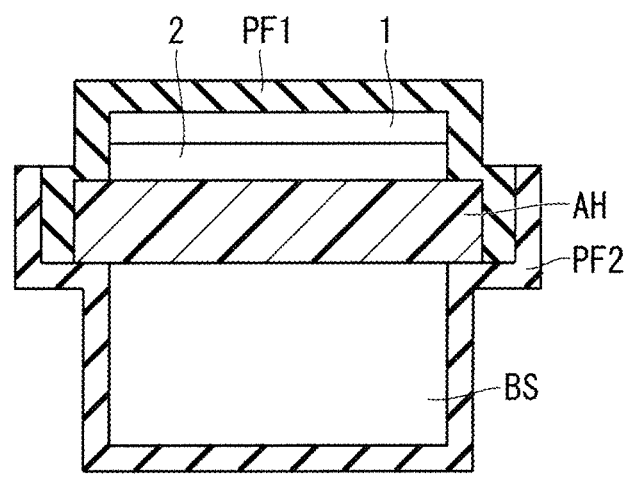
FIG. 5 is a cross-sectional view for describing the method for manufacturing the semiconductor substrate of the first embodiment according to the present invention.

FIG. 5 is a diagram for describing a fourth step of forming the protective thin film layer, from the back surface (second main surface) of the support substrate BS, which is opposite to the first main surface, to the side surfaces of the adhesive layer formed of the resin adhesive layer AH.

In the fourth step, as shown in FIG. 5, a protective thin film layer PF2 (second protective thin film layer) is formed from the back surface of the support substrate BS to the side surfaces of the adhesive layer formed of the resin adhesive layer AH. Therefore, the protective thin film layer PF1 and the protective thin film layer PF2 overlap each other on the side surfaces of the adhesive layer. Note that the order of executing the third step and the fourth step may be interchanged. In this step, material, a forming method, a film forming temperature, and a film thickness of the protective thin film layer PF2 are desirably the same as those of the protective thin film layer PF1 in the third step.

Figure 6:
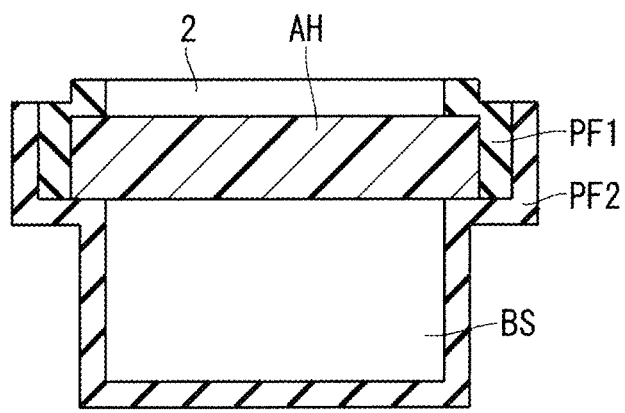
FIG. 6 is a cross-sectional view for describing the method for manufacturing the semiconductor substrate of the first embodiment according to the present invention.

FIG. 6 is a diagram for describing a fifth step of completely removing the growth substrate 1 and exposing a back surface of the nitride semiconductor layer 2.

In the fifth step, as illustrated in FIG. 6, the growth substrate 1 is completely removed to expose the nitride semiconductor layer 2. As a method for exposing the nitride semiconductor layer 2, a known method such as mechanical polishing, chemical mechanical polishing (CMP), dry etching, or wet etching with a solution can be used, and the CMP is preferably used. In the case of performing this step by the CMP, because the exposed surface is precisely planarized at an atomic layer level, the strength after bonding to a new substrate in a step to be performed later is improved.

FIG. 7 is a diagram for describing a sixth step of bonding a new support substrate 10 (second support substrate) to the back surface of the nitride semiconductor layer 2.

In the sixth step, as shown in FIG. 7, the new support substrate 10 is bonded to the back surface of the nitride semiconductor layer 2. As the new support substrate 10, a material having high thermal conductivity is desirably used in order to improve the operation characteristics and reliability of the nitride semiconductor element formed in the nitride semiconductor layer 2, and a diamond substrate is preferably used. As a method for bonding the new support substrate 10, a known method such as solder bonding, room-temperature activated bonding, or adhesion using an adhesive can be used. In order to improve the performance and reliability of the nitride semiconductor element, the interfacial thermal resistance between the nitride semiconductor layer 2 and the new support substrate 10 is desirably reduced as much as possible. Therefore, bonding by the room-temperature activated bonding is preferable. The room-temperature activated bonding is also referred to as Surface activated Room temperature bonding, and is a method of bonding performed by surface-treating a bonding surface in vacuum to make atoms on the surface in an active state of being easily chemically bonded.

Figure 8:
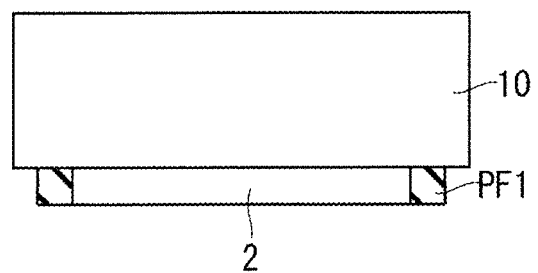
FIG. 8 is a cross-sectional view for describing the method for manufacturing the semiconductor substrate of the first embodiment according to the present invention.

FIG. 8 is a diagram for describing a seventh step of removing the support substrate BS. In the seventh step, as shown in FIG. 8, the support substrate BS on the side opposite to the support substrate 10 is removed. As the removal method, a known method can be used which includes a method of immersing the resin adhesive layer AH in a solvent to embrittle the physical properties and then peeling off the support substrate BS by a mechanical action, a method of heating and burning the resin adhesive layer AH to remove the support substrate BS, and a method of subjecting the resin adhesive layer AH to a thermal sulfuric acid treatment to oxidize and vaporize an organic component to remove the support substrate BS.

By removing the resin adhesive layer AH and the support substrate BS, the protective thin film layers PF1 and PF2 covering the side surfaces and the bottom surfaces thereof are removed, and the protective thin film layer PF1 remains on the support substrate 10 at a portion around the nitride semiconductor layer 2. The protective thin film layer PF1 may be left as it is, but, in the case of removing the same, a method of immersing the protective thin film layer PF1 in a dissolvable solution is exemplified. In the case of selecting silicon nitride as the material of the protective thin film layer PF1, a phosphoric acid-based solution can be used. Note that the semiconductor substrate 100 shown in FIG. 1 shows a case in which the protective thin film layer PF1 on the support substrate 10 at the portion around the nitride semiconductor layer 2 is removed.

Before the support substrate BS is removed in the seventh step, the protective thin film layers PF1 and PF2 may be removed by chemical treatment. Examples of the method for removing the protective thin film layers PF1 and PF2 include a method in which the protective thin film layers PF1 and PF2 are immersed in a dissolvable solution. In the case of selecting silicon nitride as the material of the protective thin film layers PF1 and PF2, a phosphoric acid-based solution, an aqueous solution containing hydrofluoric acid, or the like can be used for the removal.

In the semiconductor substrate 100 manufactured by the manufacturing method of the first embodiment described above, as described with reference to FIG. 6, because the growth substrate 1 is removed in a state in which the bonding portion between the nitride semiconductor layer 2 and the growth substrate 1 in the vicinity of the substrate end edge portion, which is likely to be the base point of the crack, is protected by the protective thin film layer PF1, the occurrence of the crack due to the internal stress contained in the nitride semiconductor layer 2 can be suppressed even when the growth substrate 1 is removed. Therefore, it is possible to obtain the semiconductor substrate 100 in which the nitride semiconductor layer 2 is provided on a heterogeneous substrate having high heat dissipation such as a diamond substrate.

By forming a light emitting element, a power amplifying element, and the like on the nitride semiconductor layer 2 of the semiconductor substrate 100 using a known manufacturing process, an increase in heat generation of each element can be suppressed, and as a result, a nitride semiconductor element with improved operation characteristics and reliability can be obtained.

Second Embodiment

Figure 9:
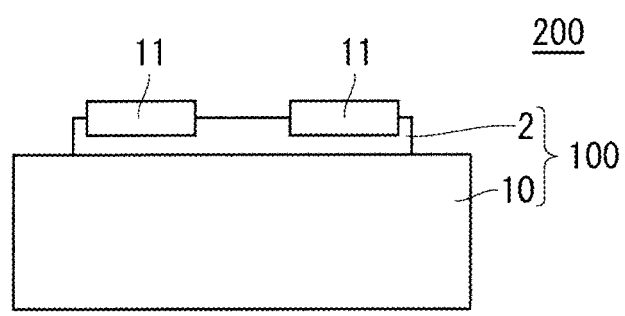
FIG. 9 is a cross-sectional view showing a configuration of a semiconductor device according to a second embodiment of the present invention.

FIG. 9 is a cross-sectional view showing a configuration of a semiconductor device 200 manufactured by a method for manufacturing a semiconductor device of the second embodiment according to the present invention.

A semiconductor device 200 shown in FIG. 9 includes, for example, nitride semiconductor elements 11 formed on a nitride semiconductor layer 2 formed on a support substrate 10 having high thermal conductivity, such as a diamond substrate. Examples of the nitride semiconductor element 11 include a high electron mobility transistor (HEMT) and the like. Note that FIG. 9 is a diagram schematically shown, and a drain electrode, a source electrode, a gate voltage, and the like of the HEMT provided on the nitride semiconductor layer 2 of a semiconductor substrate 100 are not shown in detail, and the HEMT is generally shown as a block-shaped configuration which is a configuration provided on the surface of the nitride semiconductor layer 2.

The nitride semiconductor layer 2 is a semiconductor layer formed by heteroepitaxial growth on a growth substrate different from the support substrate 10, and is transferred onto the support substrate 10 in a state of maintaining a crystal plane developed during the heteroepitaxial growth as it is. Thus, the nitride semiconductor element 11 formed on the nitride semiconductor layer 2 is a high-quality semiconductor element.

Next, a method for manufacturing the semiconductor device 200 is described with reference to FIGS. 10 to 17 which are cross-sectional views sequentially showing manufacturing steps.

FIG. 10 illustrates a state in which, after preparing an epitaxial substrate ES including the heteroepitaxially-grown nitride semiconductor layer 2 formed on a growth substrate 1, the nitride semiconductor elements 11 is formed on the nitride semiconductor layer 2.

In the present embodiment, an HEMT is formed as the nitride semiconductor element 11 formed on the nitride semiconductor layer 2. A known manufacturing method can be used for forming the HEMT. For example, the HEMT can be formed using a manufacturing process described in the Journal of the Institute of Electronics, Information and Communication Engineers C (Vol. J86-C, No. 4, pp. 396-403, April 2003). The method for manufacturing the HEMT is not limited thereto, and a semiconductor element other than the HEMT may be formed as the nitride semiconductor element 11.

Figure 11:
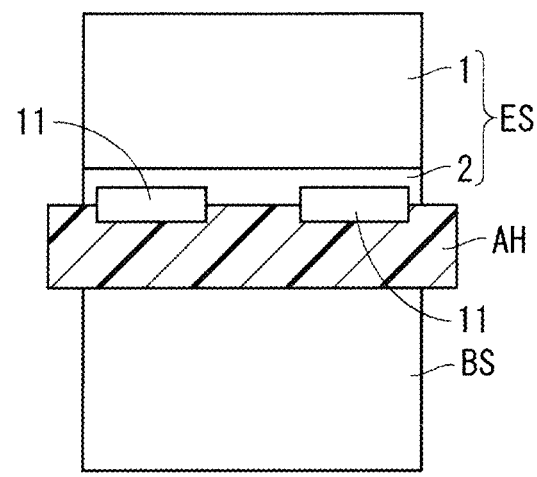
FIG. 11 is a cross-sectional view for describing the method for manufacturing the semiconductor device of the second embodiment according to the present invention.

FIG. 11 is a diagram for describing a first step of bonding a support substrate to the nitride semiconductor layer 2 on which the nitride semiconductor elements 11 are formed, using a resin adhesive layer.

In the first step, an epitaxial substrate ES on which the nitride semiconductor elements 11 are formed and a support substrate BS (first support substrate) selected from among a glass substrate, a sapphire substrate, an Si substrate, an SiC substrate, and the like are prepared, and the epitaxial substrate ES and the support substrate BS are bonded by a resin adhesive such that a main surface of the epitaxial substrate ES on a side on which the nitride semiconductor elements 11 are formed and a main surface for bonding of the support substrate BS face each other, whereby the epitaxial substrate ES and the support substrate BS are bonded by a resin adhesive layer AH.

As the resin adhesive, a known resin adhesive such as an acrylic resin, an epoxy resin, a silicone resin, or a modified silicone resin can be used, and an acrylic resin, an epoxy resin, a silicone resin, or the like is preferred.

After the bonding, a curing treatment is performed for the purpose of improving the mechanical strength of the resin adhesive layer AH. As the curing conditions, any condition can be used depending on the resin adhesive layer AH to be used. For example, a heating treatment is performed for six hours in an air blowing drying furnace at 70° C.

Because the role of the support substrate BS is to support the nitride semiconductor layer 2 in subsequent steps, the support substrate BS is not limited to the substrate described above, and any material can be used as long as the support substrate withstands the steps from the viewpoint of heat resistance, mechanical strength, and resistance to a chemical solution used in the manufacturing steps.

Figure 12:
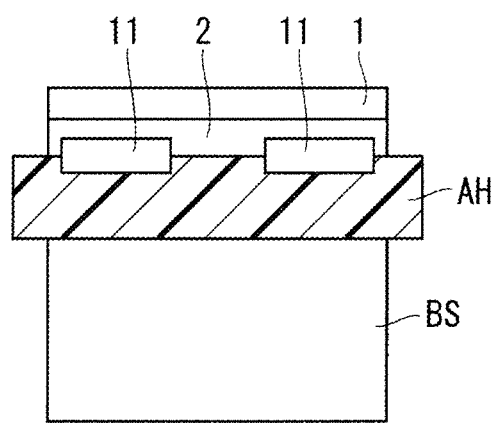
FIG. 12 is a cross-sectional view for describing the method for manufacturing the semiconductor device of the second embodiment according to the present invention.

FIG. 12 is a diagram for describing a second step of thinning the growth substrate 1 of a bonded substrate formed after the support substrate BS is bonded to the epitaxial substrate ES and the adhesive layer is cured.

In the second step, as shown in FIG. 12, a main surface (back surface) of the growth substrate 1, which is opposite to the main surface on which the nitride semiconductor layer 2 is formed, is removed to a prescribed thickness. As a removal method, mechanical polishing, dry etching, wet etching with a solution, or the like can be used, and it is preferable to use the mechanical polishing from the viewpoint of a removal rate. The thinning of the growth substrate 1 performed from the back surface side in this step is preferably performed such that the thickness of the growth substrate 1 is in a range of 5 μm or more and 100 μm or less, and more preferably performed so that the thickness of the growth substrate 1 is in a range of 7 μm or more and 30 μm or less.

If the thickness of the growth substrate 1 after this step is performed is larger than the above range, a process time in a fifth step to be performed later becomes longer, and the manufacturing cost of the semiconductor device 200 increases. On the other hand, if the thickness of the growth substrate 1 after this step is performed is smaller than the above range, the stress inside the nitride semiconductor layer 2 is released, and there is a possibility of a crack occurring.

Figure 13:
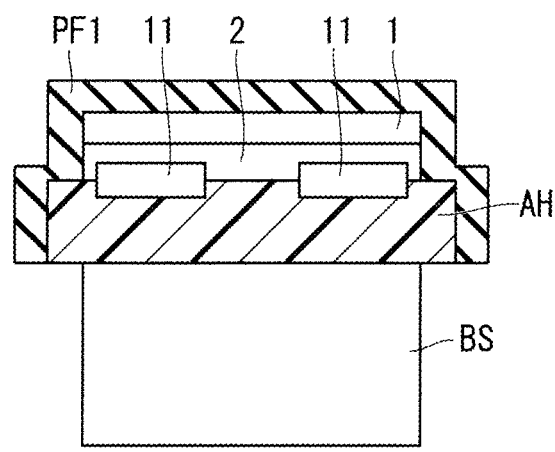
FIG. 13 is a cross-sectional view for describing the method for manufacturing the semiconductor device of the second embodiment according to the present invention.

FIG. 13 is a diagram for describing a third step of forming a protective thin film layer from the back surface of the growth substrate 1 to side surfaces of the resin adhesive layer AH, after thinning the growth substrate 1.

In the third step, as shown in FIG. 13, a protective thin film layer PF1 (first protective thin film layer) is formed from the back surface of the thinned growth substrate 1 to the side surfaces of the resin adhesive layer AH. As the protective thin film layer PF1, silicon oxide, silicon nitride, aluminum oxide, or the like can be used and any of these is suitable as the protective thin film layer PF1, and, from the viewpoint of mechanical strength, silicon nitride is preferred. The film thickness is set to, for example, 2 μm.

As a method for forming the protective thin film layer PF1, a known thin film method can be used such as a plasma CVD method, a sputtering method, an ALE method, an ALD method, a catalytic CVD method, and a solution growth method, and any of these is suitable for forming the protective thin film layer PF1. From the viewpoint of compactness of the growth film and covering properties of the side surfaces of the substrate, the ALD method is preferred.

A heating temperature at the time of film formation in the case of forming the protective thin film layer PF1 by these forming methods is desirably a temperature that does not exceed the glass transition temperature of resin as the main component of the resin adhesive layer AH. In the case of the heating temperature at the time of film formation being higher than the glass transition temperature of the resin as the main component of the adhesive layer AH, there is a possibility that the effect as an adhesive layer for bonding the support substrate BS to the epitaxial substrate ES is significantly impaired by mechanical properties of the resin adhesive layer AH being significantly deteriorated or the thermal decomposition reaction proceeding.

Figure 14:
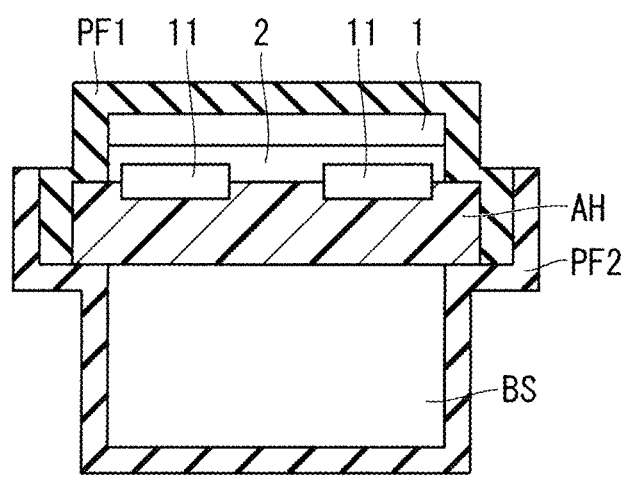
FIG. 14 is a cross-sectional view for describing the method for manufacturing the semiconductor device of the second embodiment according to the present invention.

FIG. 14 is a diagram for describing a fourth step of forming the protective thin film layer from a back surface of the support substrate BS to the side surfaces of the adhesive layer formed of the resin adhesive layer AH.

In the fourth step, as shown in FIG. 14, a protective thin film layer PF2 (second protective thin film layer) is formed from the back surface of the support substrate BS to the side surfaces of the adhesive layer formed of the resin adhesive layer AH. Therefore, the protective thin film layer PF1 and the protective thin film layer PF2 overlap each other on the side surfaces of the adhesive layer. Note that the order of executing the third step and the fourth step may be interchanged. In this step, material, a forming method, a film forming temperature, and a film thickness of the protective thin film layer PF2 are desirably the same as those of the protective thin film layer PF1 in the third step.

Figure 15:
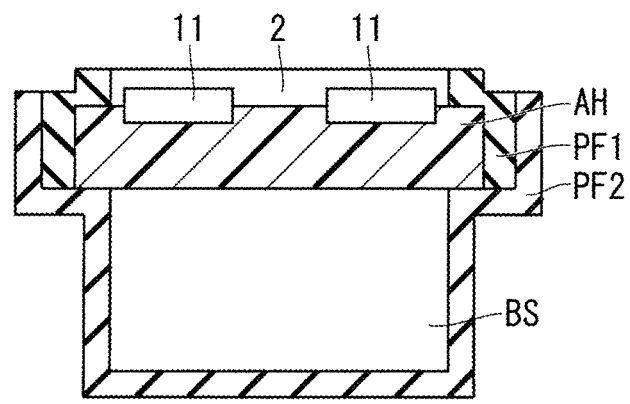
FIG. 15 is a cross-sectional view for describing the method for manufacturing the semiconductor device of the second embodiment according to the present invention.

FIG. 15 is a diagram for describing a fifth step of completely removing the growth substrate 1 and exposing a back surface of the nitride semiconductor layer 2.

In the fifth step, as shown in FIG. 15, the growth substrate 1 is completely removed to expose the nitride semiconductor layer 2. As a method for exposing the nitride semiconductor layer 2, a known method such as mechanical polishing, CMP, dry etching, or wet etching with a solution can be used, and the CMP is preferably used. In the case of performing this step by the CMP, because the exposed surface is precisely planarized at an atomic layer level, the strength after bonding to a new substrate in a step to be performed later is improved.

FIG. 16 is a diagram for describing a sixth step of bonding a new support substrate 10 (second support substrate) to the back surface of the nitride semiconductor layer 2.

In the sixth step, as shown in FIG. 16, the new support substrate 10 is bonded to the back surface of the nitride semiconductor layer 2. As the new support substrate 10, a material having high thermal conductivity is desirably used in order to improve the operation characteristics and reliability of the nitride semiconductor element formed in the nitride semiconductor layer 2, and a diamond substrate is preferably used. As a method for bonding the new support substrate 10, a known method such as solder bonding, room-temperature activated bonding, or adhesion using an adhesive can be used. In order to improve the performance and reliability of the nitride semiconductor element, the interfacial thermal resistance between the nitride semiconductor layer 2 and the new support substrate 10 is desirably reduced as much as possible. Therefore, bonding by the room-temperature activated bonding is preferable.

Figure 17:
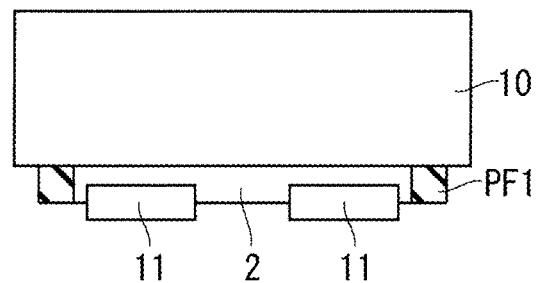
FIG. 17 is a cross-sectional view for describing the method for manufacturing the semiconductor device of the second embodiment according to the present invention.

FIG. 17 is a diagram for describing a seventh step of removing the support substrate BS. In the seventh step, as shown in FIG. 17, the support substrate BS on the side opposite to the support substrate 10 is removed. As the removal method, a known method can be used which includes a method of immersing the resin adhesive layer AH in a solvent to embrittle the physical properties and then peeling off the support substrate BS by a mechanical action, a method of heating and burning the resin adhesive layer AH to remove the support substrate BS, and a method of subjecting the resin adhesive layer AH to a thermal sulfuric acid treatment to oxidize and vaporize an organic component to remove the support substrate BS.

By removing the resin adhesive layer AH and the support substrate BS, the protective thin film layers PF1 and PF2 covering the side surfaces and the bottom surfaces thereof are removed, and the protective thin film layer PF1 remains on the support substrate 10 at a portion around the nitride semiconductor layer 2. The protective thin film layer PF1 may be left as it is, but, in the case of removing the same, a method of immersing the protective thin film layer PF1 in a dissolvable solution is exemplified. In the case of selecting silicon nitride as the material of the protective thin film layer PF1, the removal can be performed using a phosphoric acid-based solution, an aqueous solution containing hydrofluoric acid, or the like. Note that the semiconductor device 200 shown in FIG. 9 shows a case in which the protective thin film layer PF1 on the support substrate 10 at the portion around the nitride semiconductor layer 2 is removed.

Before the support substrate BS is removed in the seventh step, the protective thin film layers PF1 and PF2 may be removed by chemical treatment.

In the semiconductor device 200 manufactured by the manufacturing method of the second embodiment described above, as described with reference to FIG. 15, because the growth substrate 1 is removed in a state in which the bonding portion between the nitride semiconductor layer 2 and the growth substrate 1 in the vicinity of the substrate end edge portion, which is likely to be the base point of the crack, is protected by the protective thin film layer PF1, the occurrence of the crack due to the internal stress contained in the nitride semiconductor layer 2 can be suppressed even when the growth substrate 1 is removed. Therefore, the nitride semiconductor elements 11 provided on the nitride semiconductor layer 2 can be relocated to a heterogeneous substrate having high heat dissipation, such as a diamond substrate, without impairing operation characteristics and reliability. As a result, the semiconductor device 200 with improved operation characteristics and reliability can be obtained. Further, by forming the nitride semiconductor element 11 on the nitride semiconductor layer 2 on the growth substrate 1 as in the second embodiment, the substrate can be easily handled in the manufacturing process of the nitride semiconductor element 11, as compared with a method in which the nitride semiconductor layer 2 is moved onto the support substrate 10 and then the nitride semiconductor element 11 is formed.

Modification Example

In the first and second embodiments described above, the nitride semiconductor layer 2 is formed on the main surface of the growth substrate 1 by the heteroepitaxial growth. However, the nitride semiconductor layer 2 is not limited to a nitride semiconductor formed by the heteroepitaxial growth, and the nitride semiconductor layer 2 may be formed of a nitride semiconductor formed by homoepitaxial growth.

Although the present invention has been described in detail, the above description is illustrative in all aspects, and the present invention is not limited thereto. It is understood that countless variations that are not illustrated can be envisaged without departing from the scope of the present invention.

It should be noted that in the present invention, each of the embodiments can be freely combined, and each of the embodiments can be appropriately modified and omitted, within the scope of the present invention.

The invention claimed is:

1. A method for manufacturing a semiconductor substrate, the method comprising:
   (a) preparing an epitaxial substrate formed by epitaxially growing a nitride semiconductor layer on a first main surface of a growth substrate being a nitride semiconductor substrate and preparing a first support substrate, forming a resin adhesive layer between the first main surface of the growth substrate and a first main surface of the first support substrate, and bonding the epitaxial substrate to the first support substrate;
   (b) removing, after the step (a), a second main surface of the growth substrate to a prescribed thickness to thin the growth substrate, the second main surface of the growth substrate being on a side opposite to the first main surface of the growth substrate on which the nitride semiconductor layer is formed;
   (c) forming, after the step (b), a first protective thin film layer from the second main surface of the thinned growth substrate to side surfaces of the resin adhesive layer;
   (d) forming, after the step (b), a second protective thin film layer from a second main surface of the first support substrate to the side surfaces of the resin adhesive layer, the second main surface of the first support substrate being on a side opposite to the first main surface of the first support substrate;
   (e) removing, after the steps (c) and (d), the thinned growth substrate and exposing the nitride semiconductor layer;
   (f) bonding, after the step (e), a second support substrate onto the nitride semiconductor layer; and
   (g) removing, after the step (f), the first support substrate and the resin adhesive layer.

2. The method for manufacturing the semiconductor substrate according to claim 1, wherein each of the steps (c) and (d) further comprises a step of forming the first or second protective thin film layer such that a film formation temperature at a time of forming the first or second protective thin film layer is lower than a glass transition temperature of a resin constituting the resin adhesive layer.

3. The method for manufacturing the semiconductor substrate according to claim 1, wherein each of the steps (c) and (d) further comprises a step of forming the first or second protective thin film layer by any of an atomic layer deposition method, a sputtering method, a plasma CVD method, and a catalytic CVD method.

4. The method for manufacturing the semiconductor substrate according to claim 3, wherein each of the steps (c) and (d) further comprises a step of forming the first or second protective thin film layer with any of silicon oxide, silicon nitride, and aluminum oxide.

5. The method for manufacturing the semiconductor substrate according to claim 1, wherein the step (b) includes thinning the growth substrate to make a thickness of the growth substrate be in a range of 7 µm or more and 30 µm or less.

6. A method for manufacturing a semiconductor device, the method comprising:
   (a) preparing an epitaxial substrate formed by epitaxially growing a nitride semiconductor layer on a first main surface of a growth substrate being a nitride semiconductor substrate, and forming a nitride semiconductor element on the nitride semiconductor layer;
   (b) preparing a first support substrate, forming a resin adhesive layer between the first main surface of the growth substrate and a first main surface of the first support substrate so as to enclose the nitride semiconductor element, and bonding the epitaxial substrate to the first support substrate;
   (c) removing, after the step (b), a second main surface of the growth substrate to a prescribed thickness to thin the growth substrate, the second main surface of the growth substrate being on a side opposite to the first main surface of the growth substrate on which the nitride semiconductor element is formed;
   (d) forming, after the step (c), a first protective thin film layer from the second main surface of the thinned growth substrate to side surfaces of the resin adhesive layer;
   (e) forming, after the step (c), a second protective thin film layer from a second main surface of the first support substrate to the side surfaces of the resin adhesive layer, the second main surface of the first support substrate being on a side opposite to the first main surface of the first support substrate;
   (f) removing, after the steps (d) and (e), the thinned growth substrate and exposing the nitride semiconductor layer;
   (g) bonding, after the step (f), a second support substrate onto the nitride semiconductor layer; and
   (h) removing, after the step (g), the first support substrate and the resin adhesive layer.

7. The method for manufacturing the semiconductor device according to claim 6, wherein each of the steps (d) and (e) further comprises a step of forming the first or second protective thin film layer such that a film formation temperature at a time of forming the first or second protective thin film layer is lower than a glass transition temperature of a resin constituting the resin adhesive layer.

8. The method for manufacturing the semiconductor device according to claim 6, wherein each of the steps (d) and (e) further comprises a step of forming the first or second protective thin film layer by any of an atomic layer deposition method, a sputtering method, a plasma CVD method, and a catalytic CVD method.

9. The method for manufacturing the semiconductor device according to claim 8, wherein each of the steps (d) and (e) further comprises a step of forming the first or second protective thin film layer with any of silicon oxide, silicon nitride, and aluminum oxide.

10. The method for manufacturing the semiconductor device according to claim 6, wherein the step (c) includes thinning the growth substrate to make a thickness of the growth substrate be in a range of 7 µm or more and 30 µm or less.

* * * * *